US011683945B2

United States Patent
Wu et al.

(10) Patent No.: US 11,683,945 B2
(45) Date of Patent: Jun. 20, 2023

(54) DISPLAY DEVICE

(71) Applicant: InnoLux Corporation, Miao-Li County (TW)

(72) Inventors: Yu-Hsien Wu, Miao-Li County (TW); Yu-Sheng Tsai, Miao-Li County (TW); Kuan-Feng Lee, Miao-Li County (TW); Chandra Lius, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 159 days.

(21) Appl. No.: 17/369,016

(22) Filed: Jul. 7, 2021

(65) Prior Publication Data

US 2021/0336181 A1  Oct. 28, 2021

Related U.S. Application Data

(63) Continuation of application No. 16/880,014, filed on May 21, 2020, now Pat. No. 11,088,342, which is a
(Continued)

(30) Foreign Application Priority Data

Dec. 5, 2016 (CN) .......................... 201611103382.6

(51) Int. Cl.
*G09G 3/34* (2006.01)
*H10K 50/805* (2023.01)
(Continued)

(52) U.S. Cl.
CPC ......... *H10K 50/805* (2023.02); *G09G 3/3406* (2013.01); *H10K 50/813* (2023.02); *H10K 59/126* (2023.02); *H10K 59/127* (2023.02); *H10K 59/131* (2023.02); *G09G 2310/0264* (2013.01)

(58) Field of Classification Search
CPC .......... G09G 3/3406; G09G 2310/0264; H01L 27/3272; H01L 27/3276; H01L 27/3251
See application file for complete search history.

(56) References Cited

U.S. PATENT DOCUMENTS

2006/0145601 A1* 7/2006 Kim ..................... H01L 27/3253
313/504
2010/0065849 A1* 3/2010 Lee ..................... H01L 27/1281
257/E21.532
(Continued)

*Primary Examiner* — Kevin M Nguyen
(74) *Attorney, Agent, or Firm* — McClure, Qualey & Rodack, LLP

(57) ABSTRACT

A display device is provided. The display device includes a substrate, a driving transistor, a first insulation layer, a first electrode and a second insulation layer. The driving transistor is disposed on the substrate and includes a gate electrode, and the gate electrode projects a first projection profile on the substrate. The first insulation layer is disposed on the driving transistor. The first electrode is disposed on the first insulation layer, and projects a second projection profile on the substrate. The second insulation layer is disposed on the first electrode and the first insulation layer. The second insulation layer has an opening, the opening exposes a portion of the first electrode, and the opening projects a third projection profile on the substrate.

14 Claims, 3 Drawing Sheets

Related U.S. Application Data continuation of application No. 16/266,407, filed on Feb. 4, 2019, now Pat. No. 10,693,100, which is a continuation of application No. 15/814,727, filed on Nov. 16, 2017, now Pat. No. 10,243,161.

(51) Int. Cl.
*H10K 50/813* (2023.01)
*H10K 59/126* (2023.01)
*H10K 59/127* (2023.01)
*H10K 59/131* (2023.01)

(56) References Cited

U.S. PATENT DOCUMENTS

2016/0172633 A1* 6/2016 Ahn .................. H01L 27/3272
257/40
2016/0233288 A1* 8/2016 Lee .................... H01L 27/3262

\* cited by examiner

DISPLAY DEVICE

CROSS REFERENCE TO RELATED APPLICATIONS

This application is a Continuation of application Ser. No. 16/880,014, filed May 21, 2020, which is a Continuation of application Ser. No. 16/266,407, filed Feb. 4, 2019 (now U.S. Pat. No. 10,693,100, issued on Jun. 23, 2020), which is a Continuation of application Ser. No. 15/814,727, filed Nov. 16, 2017 (now U.S. Pat. No. 10,243,161, issued on Mar. 26, 2019, which claims the benefit of China Patent Application No. 201611103382.6, filed Dec. 5, 2016, the entirety of which are incorporated by reference herein.

BACKGROUND OF THE DISCLOSURE

Field of the Disclosure

The present disclosure relates to a display device, and in particular to an organic light-emitting display device.

Description of the Related Art

Recently, there has been much development of technologies applicable for use in electronic products. Electronic products such as mobile phones, personal digital assistants (PDA), and notebook computers require flat panel displays (FPD) that are smaller and use less power. Examples of such flat panel displays (FPD) include liquid-crystal display (LCD) devices, organic light-emitting display (OLED) devices, micro-electromechanical (MEMS) devices, and electrophoretic display (EPD) devices. The level of brightness provided by current organic light-emitting display devices is uneven, and improvement is desired.

BRIEF SUMMARY OF THE DISCLOSURE

In one embodiment, a display device is provided. The display device includes a substrate, a driving transistor, a first insulation layer, a first electrode and a second insulation layer. The driving transistor is disposed on the substrate, wherein the driving transistor comprises a gate electrode, and the gate electrode projects a first projection profile on the substrate. The first insulation layer is disposed on the drive transistor. The first electrode is disposed on the first insulation layer, wherein the first electrode projects a second projection profile on the substrate. The second insulation layer is disposed on the first electrode and the first insulation layer, wherein the second insulation layer has an opening, the opening exposes a portion of the first electrode, and the opening projects a third projection profile on the substrate. The first projection profile intersects the second projection profile at a first intersection point and a second intersection point, an extending line passes the first intersection point and the second intersection point, and the extending line intersects the third projection profile at a third intersection point.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

In this disclosure, the object A is disposed (or located) on (or above) object B means that object A is indirectly on object B, and one or more films can be formed between object A and object B. Or, alternatively, it means that object A is directly on object B, and no other film is present between object A and object B.

Figure 1:
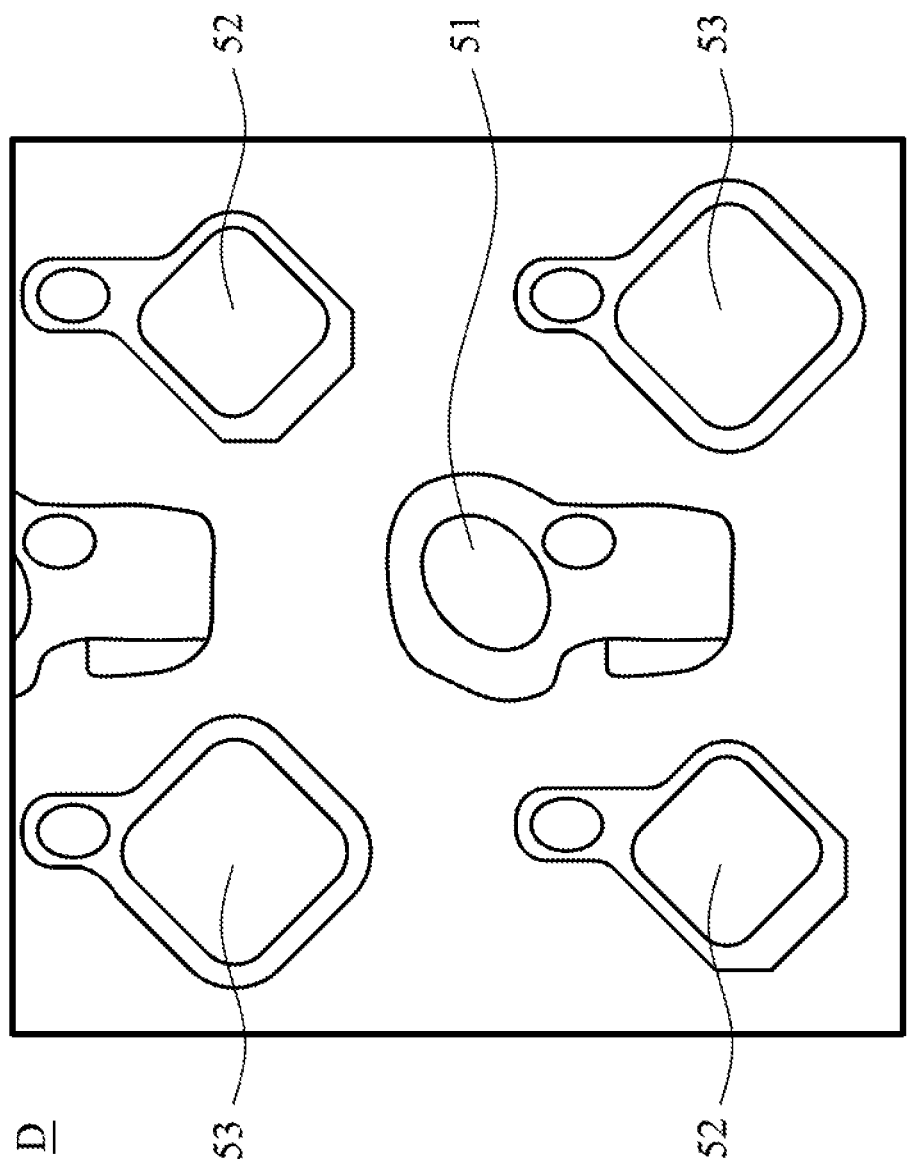
FIG. 1 shows a display device of an embodiment of the disclosure.
Figure 2:
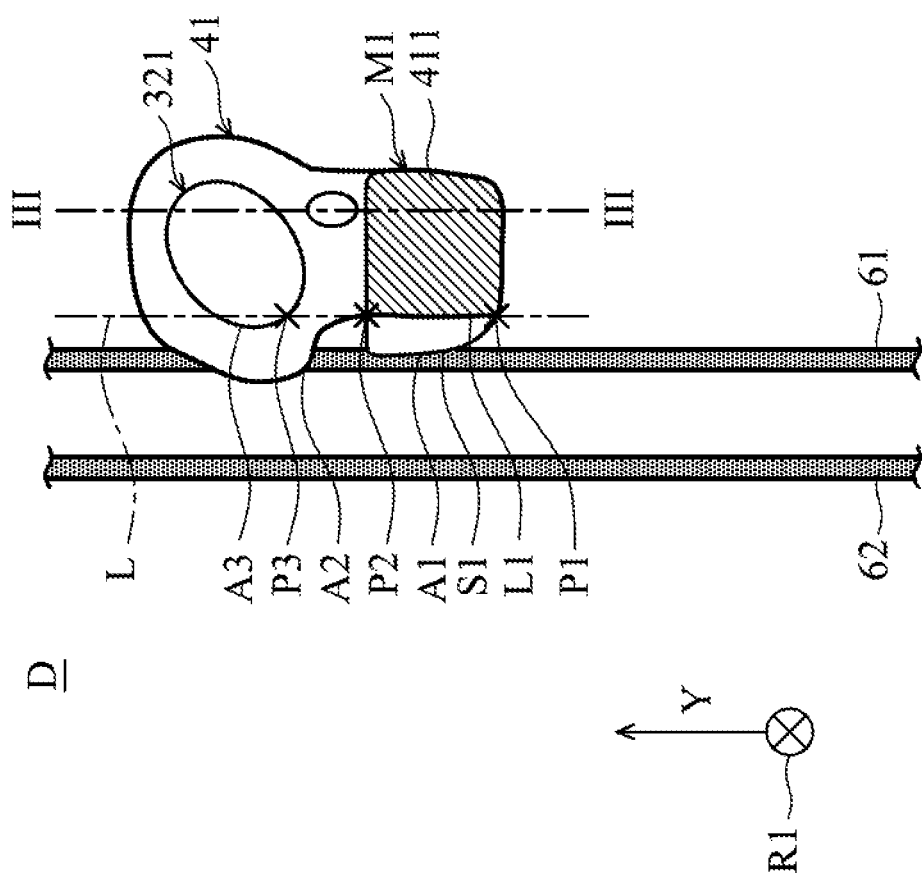
FIG. 2 shows the major structure of the display device of the embodiment of the disclosure.
Figure 3:
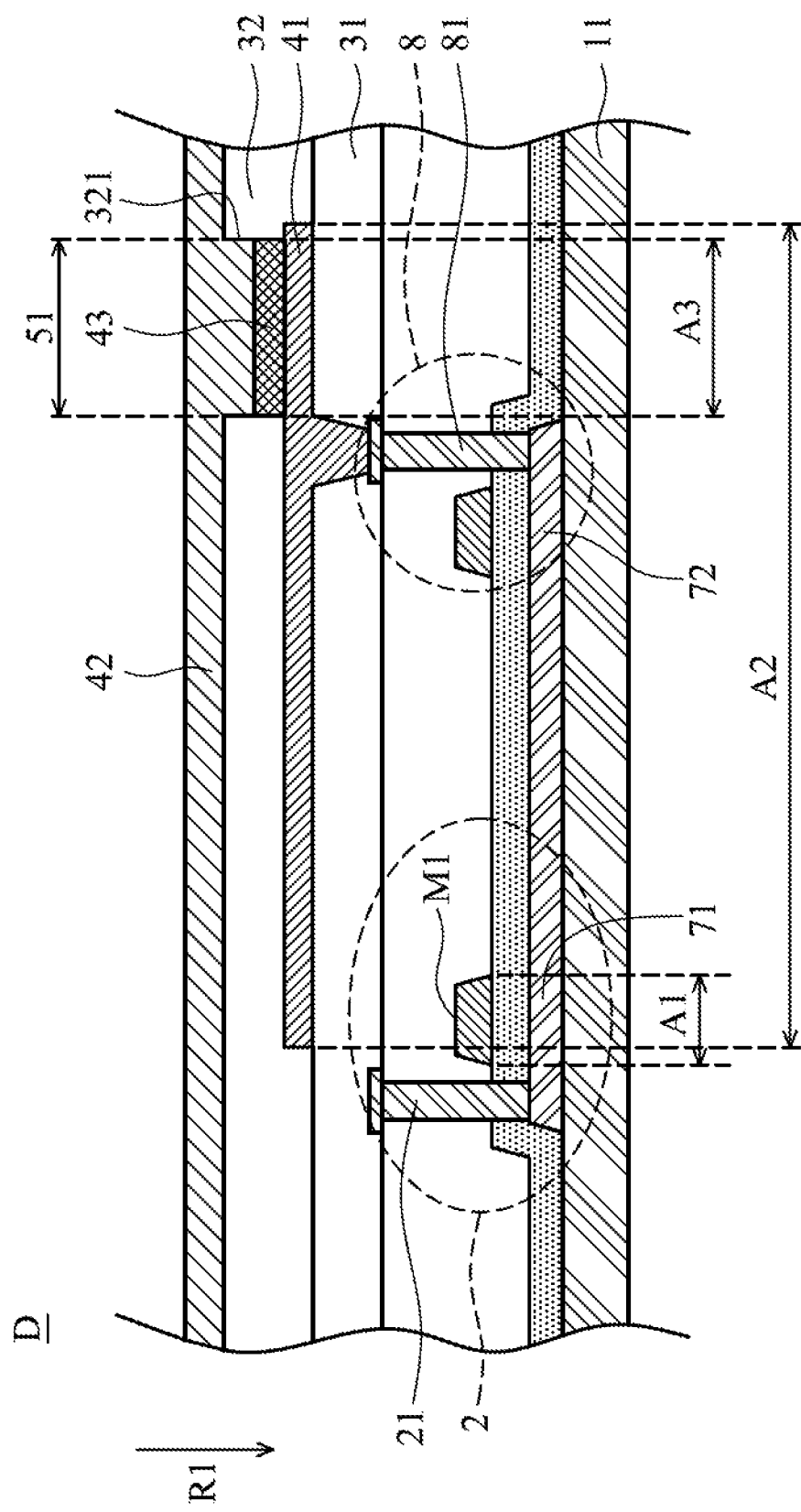
FIG. 3 is a sectional view along the direction of FIG. 2.

FIG. 1 shows a display device of an embodiment of the disclosure. FIG. 2 shows the major structure of the display device of the embodiment of the disclosure. FIG. 3 is a sectional view along the direction III-III of FIG. 2. With reference to FIGS. 1, 2 and 3, the display device D includes a substrate 11, a driving transistor 2, a first insulation layer 31, a first electrode 41 and a second insulation layer 32.

The driving transistor 2 is disposed on the substrate 11. The driving transistor 2 includes a gate electrode M1, an active layer 71, a source electrode and a drain electrode. FIG. 3 shows the source electrode or the drain electrode 21. The gate electrode M1 projects a first projection profile A1 on the substrate 11. The first insulation layer 31 is disposed on the driving transistor 2. The first electrode 41 is disposed on the first insulation layer 31. The first electrode 41 projects a second projection profile A2 on the substrate 11. The second insulation layer 32 is disposed on the first electrode 41 and the first insulation layer 31. The second insulation layer 32 has an opening 321. The opening 321 exposes a portion of the first electrode 41. The opening 321 projects a third projection profile A3 on the substrate 11. The first projection profile A1 intersects the second projection profile A2 at a first intersection point P1 and a second intersection point P2. An extending line L passes the first intersection point P1 and the second intersection point P2. The extending line L intersects the third projection profile A3 at a third intersection point P3.

With reference to FIG. 3, according to some embodiments, the display device D further includes an illumination layer 43 and a second electrode 42. The illumination layer 43 is located between the first electrode 41 and the second electrode 42. According to some embodiments, the illumination layer 43 is located in the opening 321 and on the first electrode 41. The second electrode 42 is located on the illumination layer 43. The second electrode 42 can be disposed on the second insulation layer 32, and the second electrode 42 can be partially located in the opening 321. In some embodiments, the first electrode 41 can be an anode, and the second electrode 42 can be a cathode. In some embodiments, the illumination layer 43 can be an organic illumination layer, and thus, the display device D can be an organic light-emitting display device (OLED device). According to other embodiment, the display D can also be a micro LED display device.

With reference to FIGS. 2 and 3, in this embodiment, the opening 321 corresponds to a first illumination area 51. In a conventional organic light-emitting display device, a portion of the light provided by the illumination area is reflected to a channel area of the driving transistor, the current of the driving transistor is therefore unstable, and the brightness of the display device is altered, making the display having a non-uniform brightness performance. Utilizing the embodiments of the disclosure, the first electrode 41 at least partially overlaps the gate electrode M1. The first intersection point P1, the second intersection point P2 and the third intersection point P3 are located on the same extending line L. Therefore, the light provided by the first illumination area 51 can be blocked by the first electrode 41. Thus, the first active layer 71 (channel area) of the driving transistor 2 is not easily affected. The display thus can have uniform and stable brightness.

With reference to FIG. 1, the display device D further comprises a second illumination area 52 and a third illumination area 53. The first illumination area 51, the second illumination area 52 and the third illumination area 53 provide lights of different colors. According to some embodiments, the first illumination area 51 is smaller than the second illumination area 52, and the first illumination area 51 is smaller than the third illumination area 53. In other words, by at least partially overlapping the first electrode 41 of the first illumination area 51 with the gate electrode M1, the required area of the first electrode is decreased.

FIG. 1 shows the embodiment having two second illumination areas 52 and two third illumination areas 53. The first illumination area 51 is located between the two second illumination areas 52, and the first illumination area 51 is located between the two third illumination areas 53. In some embodiments, the first illumination area 51 provides the green light, the second illumination areas 52 provide the red light, and the third illumination areas 53 provide the blue light. In another embodiment, the second illumination areas 52 provide the blue light, and the third illumination areas 53 provide the red light.

With reference to FIGS. 2 and 3, in some embodiments, when viewed in a first direction R1, the first electrode 41 at least partially overlaps the gate electrode M1 to form a first portion 411 (marked by diagonal lines). The first direction R1 is perpendicular to the substrate 11. When viewed in the first direction R1, the first portion 411 is separated from the opening 321. In other words, the first portion 411 does not overlap the opening 321. The display thus can prove uniform and stable illumination.

With reference to FIG. 2, in some embodiments, the display device D further includes a power line 61, and the power line 61 is electrically connected to the driving transistor 2. The first portion 411 does not overlap the power line 61. In other words, when viewed in the first direction R1, the first portion 411 is separated from the power line 61. The parasitic capacitance between the first portion 411 and the power line 61 is therefore prevented. In some embodiments, the display device D further includes a data line 62 disposed on the substrate 11. The data line 62 can be parallel to the power line 61, and extends in a second direction Y. The power line 61 can be located between the data line 62 and the first portion 411 of the first electrode 41.

In some embodiments, the first projection profile A1 intersects the second projection profile A2 at the first intersection point P1 and the second intersection point P2. The extending line L passes the first intersection point P1 and the second intersection point P2. An included angle is formed between the extending line L and the second direction Y and is between 0 degrees and 45 degrees. For example, the included angle is between 0 degrees and 30 degrees, or between 0 degrees and 20 degrees, or between 0 degrees and 10 degrees, or between 0 degrees and 5 degrees. In some embodiments, the first intersection point P1 and the second intersection point P2 are adjacent to a first side S1 of the gate electrode M1. The first side S1 is the side closer to the power line 61. The first side S1 can also be the side closer to the data line 62. According to some embodiments, when viewed in the first direction R1, the first side S1 of the gate electrode at least partially overlaps the power line 61.

With reference to FIG. 3, in some embodiments, the display device D further includes an illumination transistor 8. The illumination transistor 8 can be coupled to the first electrode 41. For example, the illumination transistor 8 can be coupled to the first electrode 41 via the source electrode or the drain electrode 81. The illumination transistor 8 can be located between the driving transistor 2 and the first illumination area 51. The illumination transistor 8 can include a second active layer 72. The second active layer 72 of illumination transistor 8 and the first active layer 71 of the driving transistor 2 can be of the same layer, and the second active layer 72 can be connected to the first active layer 71.

According to some embodiments, the gate electrode of the driving transistor at least partially overlaps the first electrode of the illumination area. The first projection profile of the gate electrode projected on the substrate intersects the second projection profile of the first electrode projected on the substrate at the first intersection point and the second intersection point. The extending line passing the first intersection point and the second intersection point intersects the third projection profile of the opening projected on the substrate at the third intersection point. The light provided by the illumination can be blocked by the first electrode. Thus, the channel area of the driving transistor is not easily affected. The display can thus have uniform and stable brightness.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, comprising:
   a substrate;
   a power line disposed on the substrate;
   a transistor disposed on the substrate, the transistor comprising a gate electrode; and
   a first electrode disposed on the gate electrode, wherein the first electrode partially overlaps the power line,
   wherein in view of a first direction perpendicular to the substrate, the first electrode partially overlaps the gate electrode to form a first portion, and the first portion is included in the first electrode and is separated from the power line.

2. The display device as claimed in claim 1, wherein the first electrode is an anode.

3. The display device as claimed in claim 1, comprising an illumination area, wherein the illumination area overlaps the first electrode.

4. The display device as claimed in claim 3, wherein the illumination area provides a green light.

5. The display device as claimed in claim 3, wherein the illumination area provides a blue light.

6. The display device as claimed in claim 3, wherein the illumination area provides a red light.

7. The display device as claimed in claim 1, wherein the first electrode partially overlaps the power line to form a second portion, and the second portion is included in the first electrode and is separated from the gate electrode.

8. The display device as claimed in claim 1, wherein the display device is an organic light-emitting display device.

9. The display device as claimed in claim 1, wherein the power line is electrically connected to the transistor.

10. The display device as claimed in claim 1, wherein the transistor is a driving transistor.

11. The display device as claimed in claim 10, comprising an illumination transistor, wherein the driving transistor includes a first active layer, the illumination transistor includes a second active layer, and the second active layer is connected to the first active layer.

12. The display device as claimed in claim 11, wherein the first electrode of the driving transistor is coupled to the illumination transistor.

13. The display device as claimed in claim 10, comprising an illumination transistor, wherein the driving transistor includes a first active layer, the illumination transistor includes a second active layer, and the first active layer and the second active layer are of the same layer.

14. The display device as claimed in claim 1, comprising a data line, wherein in view of the first direction perpendicular to the substrate, the power line is disposed between the data line and the first portion.

* * * * *